(12) United States Patent
Wu (10) Patent No.: US 7,015,091 B1
(45) Date of Patent: Mar. 21, 2006

(54) INTEGRATION OF SILICON CARBIDE INTO DRAM CELL TO IMPROVE RETENTION CHARACTERISTICS

(75) Inventor: Yung Hsien Wu, Taipei (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 10/990,511

(22) Filed: Nov. 18, 2004

(51) Int. Cl.
*H01L 21/8242* (2006.01)

(52) U.S. Cl. ...................... 438/243; 438/247

(58) Field of Classification Search ........ 438/243–249, 438/386–392
See application file for complete search history.

(56) References Cited

U.S. PATENT DOCUMENTS

| | | | |
|---|---|---|---|
| 6,265,279 B1 | 7/2001 | Radens et al. | |
| 6,355,518 B1 | 3/2002 | Wu et al. | |
| 6,391,705 B1 | 5/2002 | Hsiao et al. | |
| 6,444,524 B1 | 9/2002 | Chung et al. | |
| 6,551,875 B1 | 4/2003 | Tsao | |
| 6,734,106 B1 | 5/2004 | Chung et al. | |
| 2005/0170581 A1 * | 8/2005 | Chou et al. ................. | 438/243 |

OTHER PUBLICATIONS

Ritu Tyagi et al., Self-Enclosed vs. LOPOS-Terminated Lateral Planar $p^+n$ and $n^+p$ Junctions in 3C-SiC/Si, IEEE, 1996, pp. 115-118.

Takashi Uchino et al., MOSFETs with Ultrashallow Junction and Minimum Drain Area Formed by Using Solid-Phase Diffusion from SiGe, IEEE Transactions on Electron Devices, vol. 48, No. 7, Jul. 2001, pp. 1406-1411.

S.P. Wong et al., Phase Formation and Field Emission Properties of SiC/Si Heterostructures Formed by MEVVA Implantation, IEEE, 1998, pp. 92-96.

Xiang Lu et al., SiGe and SiGeC Surface Alloy Formation Using High-dose Implantation and Solid Phase Epitaxy, IEEE, 1997, pp. 686-689.

* cited by examiner

*Primary Examiner*—H. Jey Tsai
(74) *Attorney, Agent, or Firm*—Finnegan, Henderson, Farabow, Garrett & Dunner, L.L.P.

(57) ABSTRACT

A DRAM memory cell and a method of making a DRAM memory cell are provided. The DRAM memory cell includes a semiconductor substrate, including a trench formed therein and a buried plate region, at least a first doped region and a second doped region provided on a sidewall of the trench above the buried plate region in the substrate, where the first doped region contains carbon and the second doped region contains germanium provided in a portion of the first region, a dielectric layer formed on the bottom and sidewall of the trench, at least one polysilicon layer deposited in the trench and on the dielectric layer to cover the dielectric layer, and a transistor formed on a surface of the semiconductor substrate.

16 Claims, 9 Drawing Sheets

INTEGRATION OF SILICON CARBIDE INTO DRAM CELL TO IMPROVE RETENTION CHARACTERISTICS

TECHNICAL FIELD

This invention relates in general to a DRAM cell capacitor and a method of its manufacture, and more particularly to a DRAM cell capacitor having enhanced retention characteristics due to improvements in cell to bit line capacitance ratio and suppression of leakage current.

BACKGROUND INFORMATION

Dynamic random access memory (DRAM) circuits are used in the electronics industry for storing information as binary data. A DRAM typically comprises millions of memory cells tightly packed in an array on a semiconductor substrate. Each of the memory cells typically includes an access transistor and a storage capacitor, and the cells are accessed using word lines and bit lines. In order to increase the density of the memory cells, the footprint of, or area occupied by, each memory cell typically should be decreased. One difficulty in reducing the area of a memory cell is that when the surface area of the capacitor storage nodes becomes too small, the capacitor cannot store a sufficient amount of electric charge, for a sufficient amount of time. Data is thus often lost due to leakage current.

Various storage capacitor and transistor structures have been proposed that occupy a relatively small area on the semiconductor substrate. For example, vertical trench capacitors have been developed that extend deep into the substrate so that the capacitor occupies less area on the surface of the substrate, yet its storage node has enough surface area in the depth direction of the substrate to retain sufficient electric charge. DRAM cells including trench capacitors thus have comparatively large capacitance while occupying a comparatively small area on a semiconductor chip surface. In particular, trench capacitors are characterized by deep and narrow trenches in the semiconductor substrate. An insulator formed on the trench walls serves as the capacitor dielectric. Capacitor plates are formed on either side of the insulator, and one of the plates is formed by refilling the trench with doped polysilicon. Typically, a horizontal field effect transistor (FET) is coupled to the trench capacitor on and in the surface of the semiconductor substrate.

In recent years, cell density has increased dramatically on the DRAM chip because of improvements in semiconductor technologies. As DRAM technology progresses, the number of memory cells on a DRAM chip, each storing a bit of information, is expected to exceed several gigabits. As this cell density increases on the chip, it is necessary to reduce the area of each cell, while at the same time improving circuit performance.

Unfortunately, as the cell size decreases, the size of the storage capacitor and cell area are often also reduced. This results in decreased charge stored on the capacitor, which, in turn, makes detection of stored charge during the read cycle more difficult due to a lower signal-to-noise ratio at the read-sense amplifiers. The cells also require more frequent refresh cycles to maintain sufficient charge on the capacitor. In addition, as cell size decreases, the capacitor is more susceptible to the effects of leakage current, which affects the capacitor's ability to retain stored electrical charge. Therefore, there is a strong need to improve the retention time of the storage capacitor while reducing the cell area.

Improvement of retention time is a key issue for realizing future high-density DRAMs, because the required retention time is a factor that doubles with each successive DRAM generation (e.g. 256 mbit—512 mbit—1 gbit, etc.). The duration of the retention time is derived from the need to keep the capacitor refresh interval constant as the number of bits increases. Two major approaches to enhance retention characteristics are therefore (i) improving the cell to bit-line capacitance ratio and (ii) suppressing leakage current.

To improve the cell to bit-line capacitance ratio, much attention has been directed to the use of high-k dielectrics in the cell capacitors. Implementation of most high-k dielectrics, however, requires the use of new semiconductor tools, such as Atomic Layer Deposition (ALD) Chemical Vapor Deposition (CVD). Without employing new semiconductor tools, however, others have increased cell capacitance by increasing the nitridation of an existent capacitor nitrogen-oxide (NO) dielectric layer. The nitridation, however, results in a higher leakage current, which degrades the capacitor charge retention characteristics.

The depth of the doped polysilicon plate recess in the trench can be reduced, thereby making a larger NO dielectric layer in the trench. Unfortunately, continuous decreasing of the doped polysilicon plate recess depth inevitably induces increased leakage current from a vertical parasitic metal-oxide-semiconductor (MOS) FET (MOSFET).

To reduce leakage current, much attention has been given to embedding silicon-on-insulator (SOI) technology in the trench region by implanting oxygen in an upper portion of the trench (e.g., the collar region), coupled with a subsequent annealing treatment. With this approach, the collar oxide is thickened, effectively increasing the thickness of a "gate" oxide in the parasitic MOSFET just discussed, thereby reducing leakage current. Although this approach could curb some amount of leakage current, the leakage current contributed by the junction between a FET and the polysilicon plate through the collar oxide still cannot be suppressed. This leakage is regarded as the most critical leakage path, because it detrimentally impacts retention performance in the current state-of-the-art D11 double-data-rate-2 (D11 DDR2) DRAM memory.

The present invention is directed to overcome one or more of the problems of the prior art.

SUMMARY OF THE INVENTION

Accordingly, the present invention is directed to a DRAM cell capacitor and a manufacturing method thereof that obviate one or more of the problems due to limitations and disadvantages of the related art.

Additional features and advantages of the invention will be set forth in the description that follows, being apparent from the description or learned by practice of the invention. The objectives and other advantages of the invention will be realized and attained by the DRAM memory cell structures and methods of manufacture particularly pointed out in the written description and claims, as well as the appended drawings.

To achieve these and other advantages, and in accordance with the purpose of the invention as embodied and broadly described, there is provided a semiconductor device, including a semiconductor substrate having a surface with a trench formed in the surface of the semiconductor substrate and having a sidewall, a first doped region including carbon provided in a sidewall of the trench, the first doped region extending a first depth into the semiconductor substrate, and a second doped region including germanium provided in a portion of the first doped region, the second doped region extending a second depth into the semiconductor substrate, the second depth being less than the first depth.

In accordance with the present invention, there is also provided a semiconductor device including a semiconductor substrate having a surface with a trench provided in the surface of the semiconductor substrate and having a sidewall, a first region in the sidewall of the trench including silicon carbide, the first region provided at a predetermined depth below the surface of the semiconductor substrate, and a second region in the sidewall of the trench including silicon germanium carbide, the second region provided between the surface of the semiconductor substrate and the first region.

In accordance with the present invention, there is also provided a DRAM memory cell that includes a semiconductor substrate with a trench formed therein and a buried plate region, at least a first doped region and a second doped region provided on a sidewall of the trench spaced from the buried plate region in the substrate, the first doped region extending a first depth into the semiconductor substrate, and the second doped region extending a second depth into the semiconductor substrate, the second depth being less than the first depth, wherein the first doped region contains carbon and the second doped region contains germanium, a dielectric layer formed on the bottom and sidewall of the trench, at least one polysilicon layer deposited in the trench and on the dielectric layer, the at least one polysilicon layer covering the dielectric layer, and a transistor formed on a surface of the semiconductor substrate.

In accordance with the present invention, there is also provided a process for manufacturing a DRAM memory cell, including providing a substrate having a trench therein and a surface covered by a mask layer, forming at least one cover layer for covering a portion of the trench, doping an exposed portion of a sidewall of the trench in the substrate with carbon and germanium impurities for forming a carbon doped region and a germanium doped region, the carbon doped region extending a first depth into the semiconductor substrate, and the germanium doped region extending a second depth into the semiconductor substrate, the second depth being less than the first depth, and performing at least one heat treatment.

In accordance with the present invention, there is further provided a process for manufacturing a DRAM memory cell, including providing a substrate having a trench therein and a surface covered by a mask layer, forming a doped oxide layer for covering a portion of the trench, doping an exposed portion of a sidewall of the trench in the substrate with carbon and germanium impurities for forming a carbon doped region and a germanium doped region, the carbon doped region extending a first depth into the semiconductor substrate, and the germanium doped region extending a second depth into the semiconductor substrate, the second depth being less than the first depth, forming a protective layer covering the doped oxide layer and the exposed portion of the sidewall of the trench; performing a heat treatment for forming a buried plate region, removing the doped oxide layer and the protective layer, forming a dielectric layer inside the trench, forming a first conductive layer with predetermined depth to act as a storage node, forming a collar oxide layer in the trench and on top of the first conductive layer, the collar oxide layer being surrounded by the carbon doped region, and performing a heat treatment for forming a silicon carbide region in a portion of the carbon doped region and for forming a silicon germanium carbide region in the germanium doped region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

Reference will now be made in detail to embodiments of the present invention, examples of which are illustrated in the accompanying drawings. Wherever possible, the same reference numbers will be used throughout the drawings to refer to the same or like parts.

Embodiments consistent with the present invention provide for a novel DRAM cell capacitor and the manufacturing method thereof. The described DRAM cell capacitor and manufacturing method obviates the problems associated with conventional DRAM cell capacitors.

To solve the problems associated with the conventional approaches discussed above and consistent with an aspect of the present invention, a memory cell is provided having silicon carbide (SiC) and germanium (Ge) doped regions in a substrate region adjacent a trench. The memory cell has enhanced capacitance and reduced leakage current and can be manufactured by a DRAM fabrication process that is not complicated and is fully compatible with existing very-large-scale-integration (VLSI) technologies.

SiC is a wide bandgap semiconductor, which is an ideal material most often applied to high-temperature and high-power devices because of its exceptional thermal and electrical properties, such as high-saturated electron drift velocity, high thermal conductivity, and high breakdown field. The present invention takes advantage of the wide bandgap properties of SiC and incorporates it into a DRAM cell to significantly reduce leakage current therein.

In a traditional Si-based device, the junction leakage in the reverse bias state comprises two components. The first component is due to diffusion current and the other is due to generation/recombination current. At most operable temperature ranges, the latter is larger than the former. To reduce junction leakage, therefore, it is desirable to suppress leakage due to generation/recombination current.

For Si-based DRAM devices, the generation and recombination of minority carriers is relatively fast, so the memory has to be refreshed frequently. In contrast to Si-only based devices, integration of wide bandgap SiC into the device reduces generation/recombination rates of the minority carriers by orders of magnitude. The generation/recombination rate for SiC is quite small when compared to its Si-only counterpart, since the intrinsic carrier concentration of SiC is lower than that of Si-only by about seventeen orders of magnitude. Utilizing the material properties of SiC in a DRAM memory cell can therefore suppress undesired leakage current.

A manufacturing method of a DRAM cell capacitor consistent with the present invention will next be described with reference to FIGS. 1–9.

Figure 1:
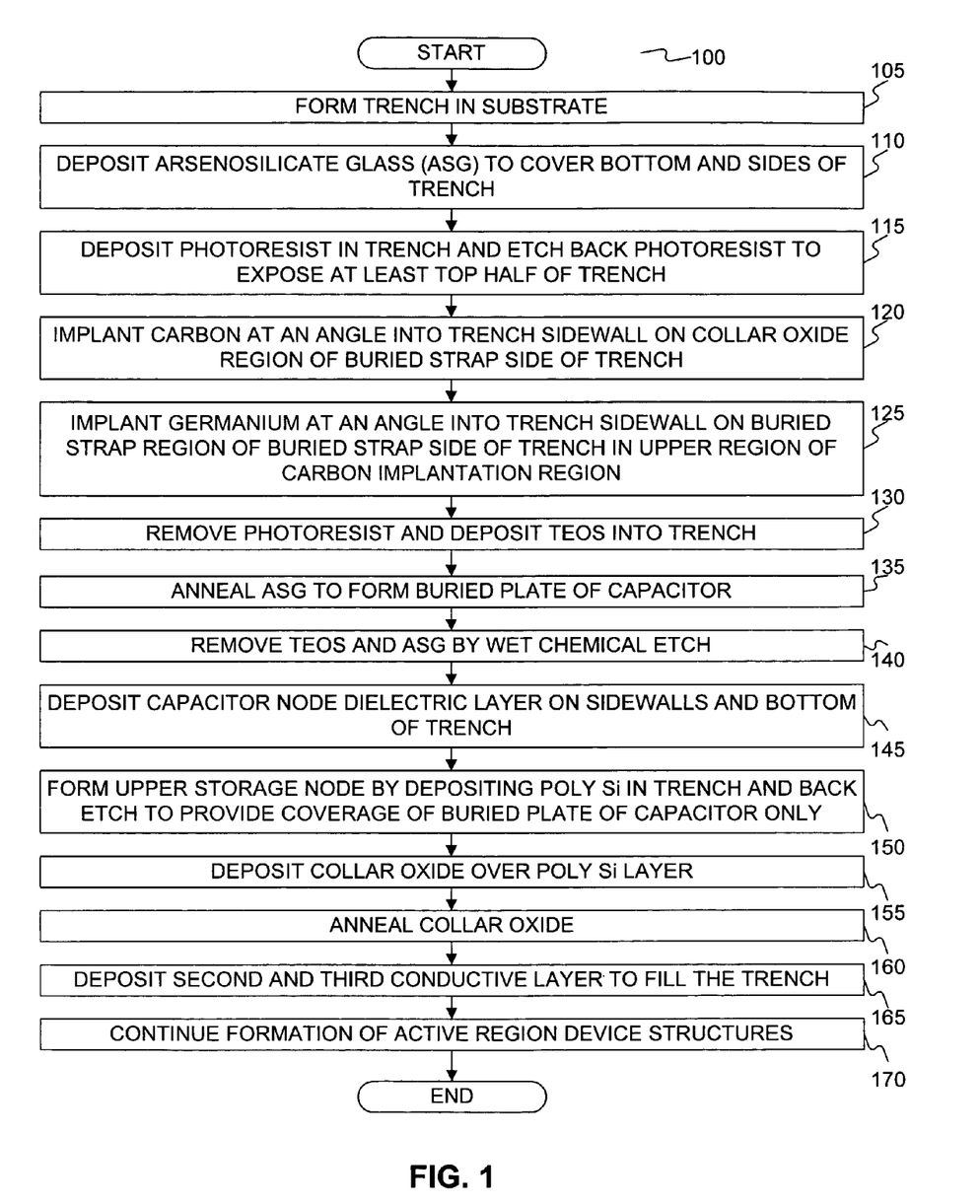
FIG. 1 illustrates a flowchart describing the steps of forming a DRAM cell capacitor according to the claimed invention.

Referring to FIG. 1, a flowchart 100 is illustrated, showing the steps for forming a DRAM cell according to an aspect of the present invention. When possible, the steps outlined in this flowchart will be referenced in the description of FIGS. 2–9.

Figure 2:
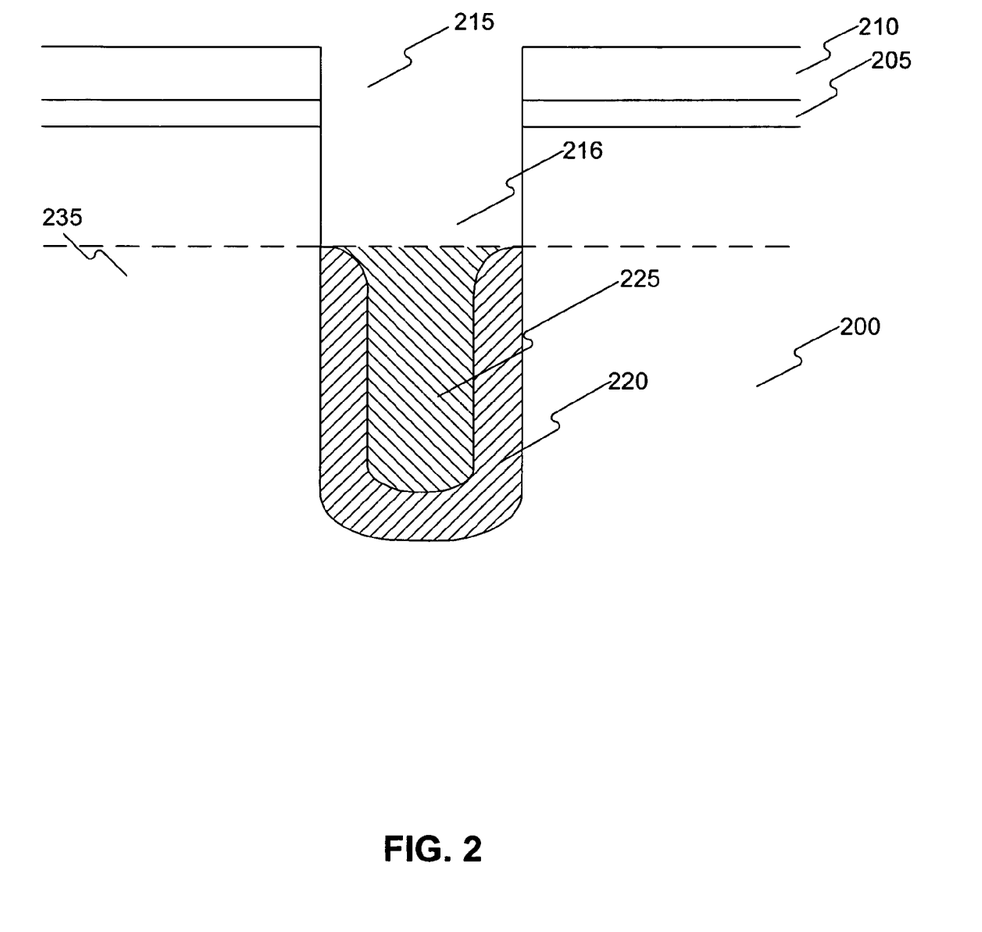
FIGS. 2–9 illustrate the steps of a manufacturing method of a DRAM cell capacitor consistent with the present invention.

Referring to FIG. 2 (corresponding to steps 105, 110, and 115 in FIG. 1), a pad oxide 205 is first grown on a semiconductor substrate 200, preferably containing a buried well region 235. A hard mask layer 210 is deposited on top of the pad oxide 205. The hard mask layer 210 is preferably composed of silicon nitride, and may be deposited on the pad oxide 205 using CVD. The pad oxide layer 205 reduces the interfacial stress between the hard mask layer 210 and the substrate 200. A photoresist (not shown in the figure) is applied in a photolithography masking process, and a dry anisotropic etch is performed to produce the opening 215 in the hard mask layer 210. Preferably, a plasma etching process is used for the dry anisotropic etch.

Still referring to FIG. 2, a dry anisotropic etch is applied to produce the trench 216 with substantially vertical sidewalls. Alternatively, the trench 216 may be formed into a bottle shape using other known processing steps. Preferably, the width of the trench 216 may be about 180 nm to about 220 nm, and its depth may be about 7 $\mu$m to about 8 $\mu$m. More preferably, the depth of the trench 216 may be about 7.5 $\mu$m, the width at a top of the trench may be about 190 nm, the width at an upper sidewall portion (e.g., a collar oxide region) of the trench may be about 160 nm, and the width at a buried plate region of the trench may be about 140 nm. Next, an impurity region is formed on the lower sidewall of the trench 216. Preferably, a cover layer, such as a dopant oxide layer (an oxide layer containing n+ dopants, such as arsenic or phosphorus) is formed on the lower sidewall of the trench 216 (the lower sidewall corresponds to both the vertical sidewall of the lower portion of the trench 216 and the bottom floor of the trench 216). More preferably, the dopant oxide layer is formed by depositing a layer of arsenosilicate glass (ASG) 220 on the lower sidewall of the trench 216 (step 110 in FIG. 1). This is achieved by depositing the layer of ASG 220 into the trench 216, followed by depositing a photoresist layer 225 on top of the layer of ASG 220. Using a plasma etch, the photoresist layer 225 is reduced to a predetermined height that is about the mid-height of the trench 216. This height may also correspond to the height of buried well region 235 in the semiconductor substrate. The portion of the layer of ASG 220 not covered by the photoresist layer 225 is then removed. Thus, the layer of ASG 220 will cover only approximately the lower sidewalls of the trench 216 in buried well region 235.

Figure 3:
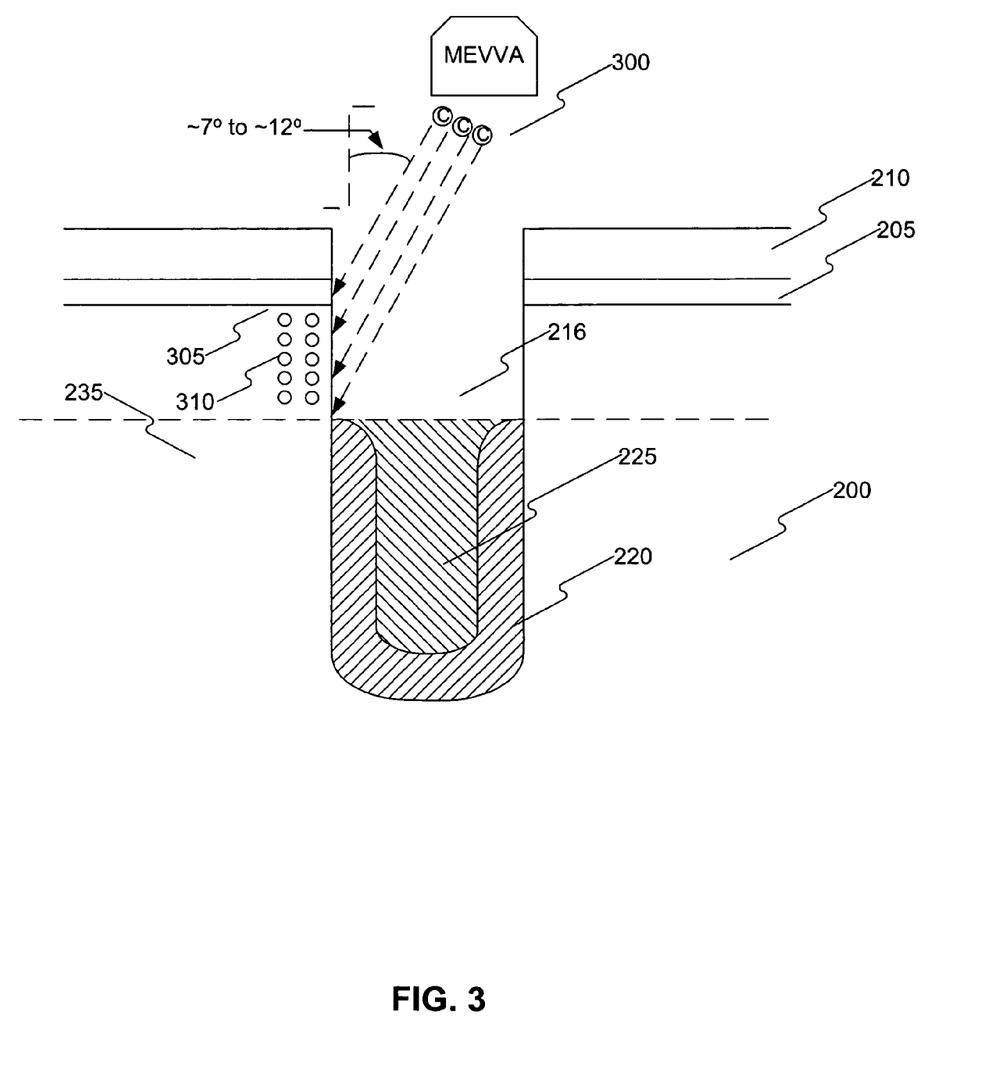

Referring to FIG. 3, a first doped region 310 is formed in an upper sidewall region (e.g., a collar oxide side) of the trench 216 (step 120 in FIG. 1). Preferably, the first doped region 310 may be formed by implanting a carbon species, such as carbon (C) 300, into a buried strap side 305 of the trench 216 (step 120 in FIG. 1). The C implantation may be performed with a metal vapor vacuum arc (MEVVA) ion source. The MEVVA ion source has a high current density implantation and uses a solid graphite source. Preferably, the C implant is performed at an energy of 35 KeV and an implant concentration of about $8\times10^{15}$ cm$^{-2}$ to about $3\times10^{16}$ cm$^{-2}$. More preferably, the C implant is performed at an angle of about 7° to about 12° from a direction perpendicular to a top surface of the substrate 200. With the C implantation, SiC can be formed during a subsequent high temperature anneal step, such as the ASG and collar oxide anneal step that is later discussed with reference to FIG. 6.

Figure 4:
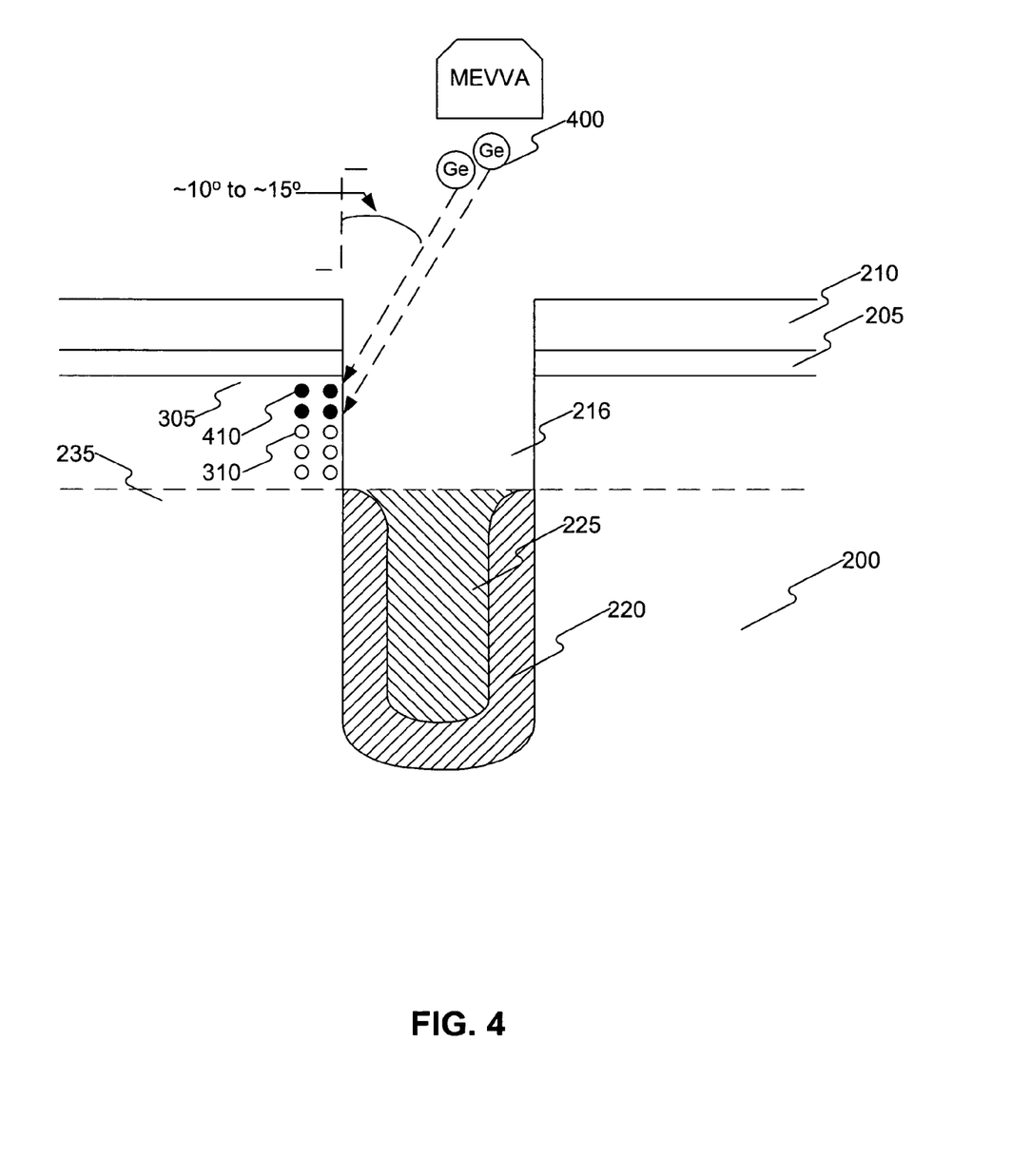

Referring to FIG. 4, a second doped region 410 is applied to the sidewalls of the trench 216 (step 125 in FIG. 1). Preferably, the second doped region 410 may be formed by implanting a germanium species, such as germanium (Ge) 400, into a buried strap side 305 of the trench 216 (step 125 in FIG. 1). Ge implantation may also be performed with a metal vapor vacuum arc (MEVVA) ion source at an energy of 35 KeV and an implant concentration of about $1\times10^{15}$ cm$^{-2}$ to about $5\times10^{15}$ cm$^{-2}$. The Ge implantation may extend from about 100 to about 150 nm into the substrate in a direction perpendicular to the surface of the semiconductor substrate 200. More preferably, the Ge implant is performed at an angle of about 10° to about 15° from a direction perpendicular to a top surface of the substrate 200, such that the angle of the Ge implant is larger than that of the C implant. Still more preferably, the Ge implant is only performed in about the top one-half to one-third of the carbon implant region 310, in a region where the buried strap polysilicon recess will be located. Alternatively, the second doped region 410 may be formed in a region between the surface of the semiconductor substrate 200 and the first doped region 310. With the Ge implantation in the second doped region 410, SiGeC can be formed in a portion of buried strap region 305. Synthesis of SiGeC at a subsequent high temperature anneal step, such as the ASG and collar oxide anneal step that is later discussed with reference to FIG. 6, has the advantage of reducing the resistivity of buried strap region 305 because SiGeC has a higher phosphorous (e.g. a dopant in the buried well 235) solubility as compared to conventional Si. Furthermore, the presence of C in the previous implant 310 could compensate for any built in lattice mismatch strain that would have been present in a SiGe-only structure. Accordingly, fewer strain-induced dislocations are formed, compared to pure SiGe. Moreover, SiGeC can slightly increase the bandgap compared with conventional Si to aid in reduction of junction leakage current.

Figure 5:
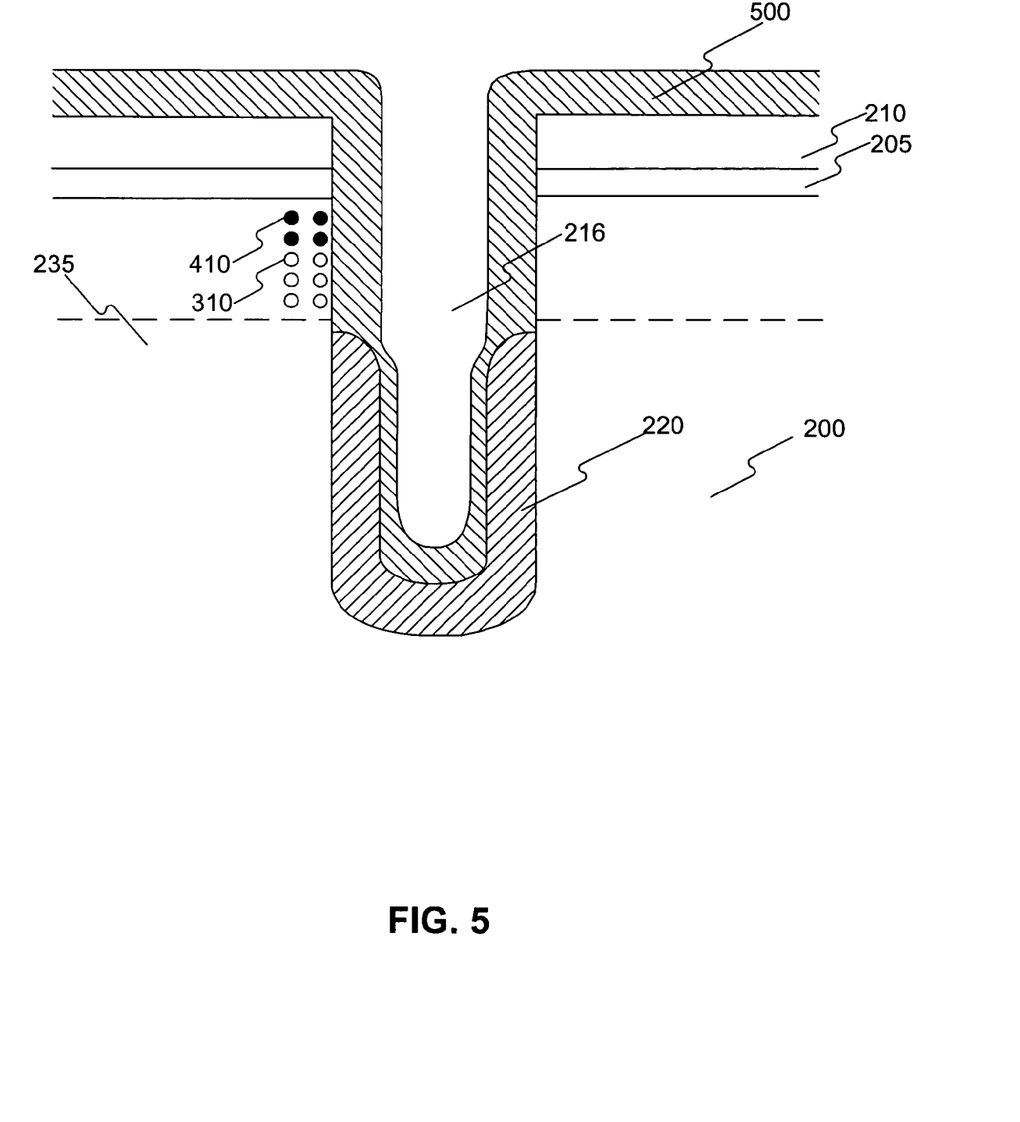

Referring to FIG. 5 (step 130 in FIG. 1), photoresist layer 225 is removed and a protective oxide layer 500 is next formed on the sidewalls of the trench 216. Preferably, the protective oxide layer 500 is tetraethylorthosilicate (TEOS) deposited to a thickness of about 40 nm to about 60 nm.

Figure 6:
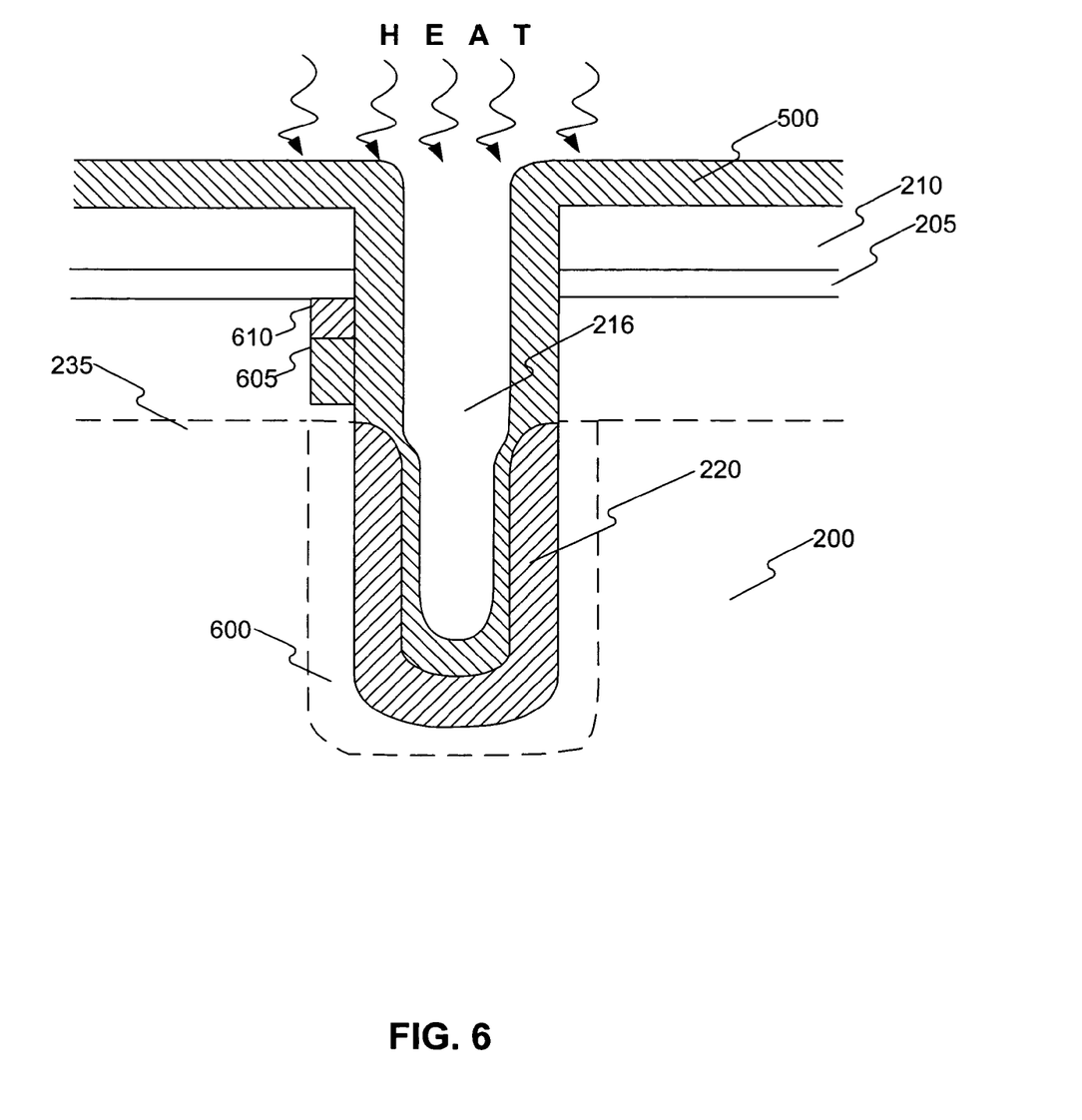

Referring to FIG. 6 (step 135 in FIG. 1), a thermal drive-in process (e.g. high-temperature anneal) is subsequently performed to diffuse dopants in the dopant oxide layer 220 into the substrate 200 in a region surrounding the lower sidewall of the trench 216, thus forming buried plate 600. The protective oxide layer 500 confines the buried plate region 600 to surround the lower half of the trench 216 by preventing dopants from laterally diffusing through the upper sidewall of the trench 216. Preferably, this thermal drive-in process is performed at a temperature of about 1050° C. for about 30 minutes. In the alternative, the thermal drive-in process could be performed at a temperature of about 1000° C. for about 45 minutes.

Still referring to FIG. 6, this thermal drive-in process not only forms the buried plate 600, but also may generate a buried SiC region 605 and a buried SiGeC region 610 from implanted regions 310 and 410 during the same annealing step 135, provided there is sufficient thermal budget. SiGeC region 610 preferably extends from a surface of the semiconductor substrate 200 to about 100 nm to about 150 nm, for example, into the semiconductor substrate in a direction perpendicular to the top surface of the semiconductor substrate, and extends about 200 nm into buried strap region 305. The dopant oxide layer 220 (e.g., ASG) is then removed, preferably through a wet etching process that also removes the protective oxide layer 500 (e.g., TEOS) (illustrated by step 140 in the flowchart 100 of FIG. 1).

Figure 7:
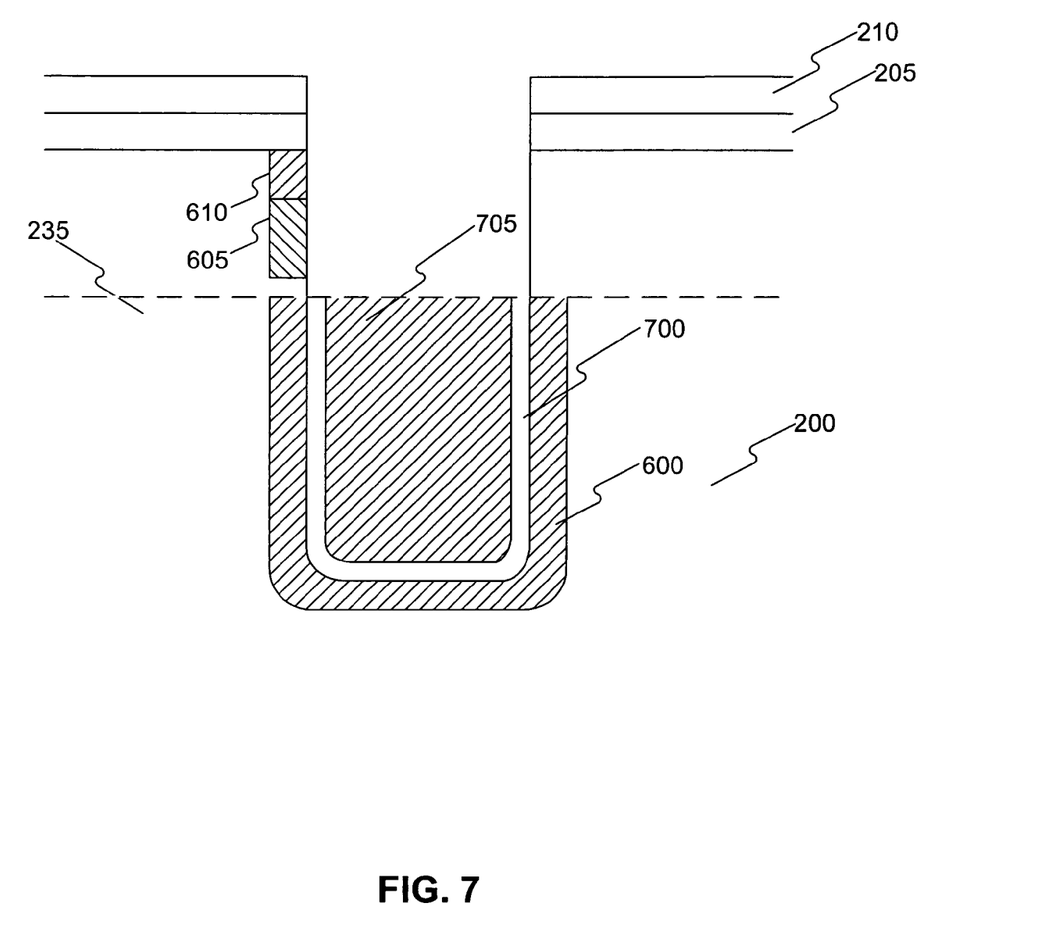

Referring to FIG. 7, a capacitor node dielectric layer 700 is deposited on the sidewall of the trench 216 (step 145 in FIG. 1). Then, an upper storage node 705 in the lower portion of the trench is formed by first depositing a conductive layer and then reducing the height of the conductive layer, such as using CMP followed by an etch-back step (step 150 in FIG. 1). Preferably, the conductive material includes polysilicon, and more preferably includes doped polysilicon.

Still referring to FIG. 7, a dry anisotropic etch is then performed to remove a portion of the capacitor node dielectric layer 700 and to reduce the height of the dielectric material within the trench 216 so that, for example, it only covers the lower sidewall of the trench 216 adjacent to the buried plate 600. Preferably, the node dielectric material is formed of silicon nitride, and is exposed to an oxidizing atmosphere to form the capacitor node dielectric of the cell capacitor (e.g., SiN, NO, ONO, etc.). The silicon nitride layer is formed by low-pressure chemical vapor deposition (LPCVD) to a thickness of about 3.5 nm to about 5 nm.

Figure 8:
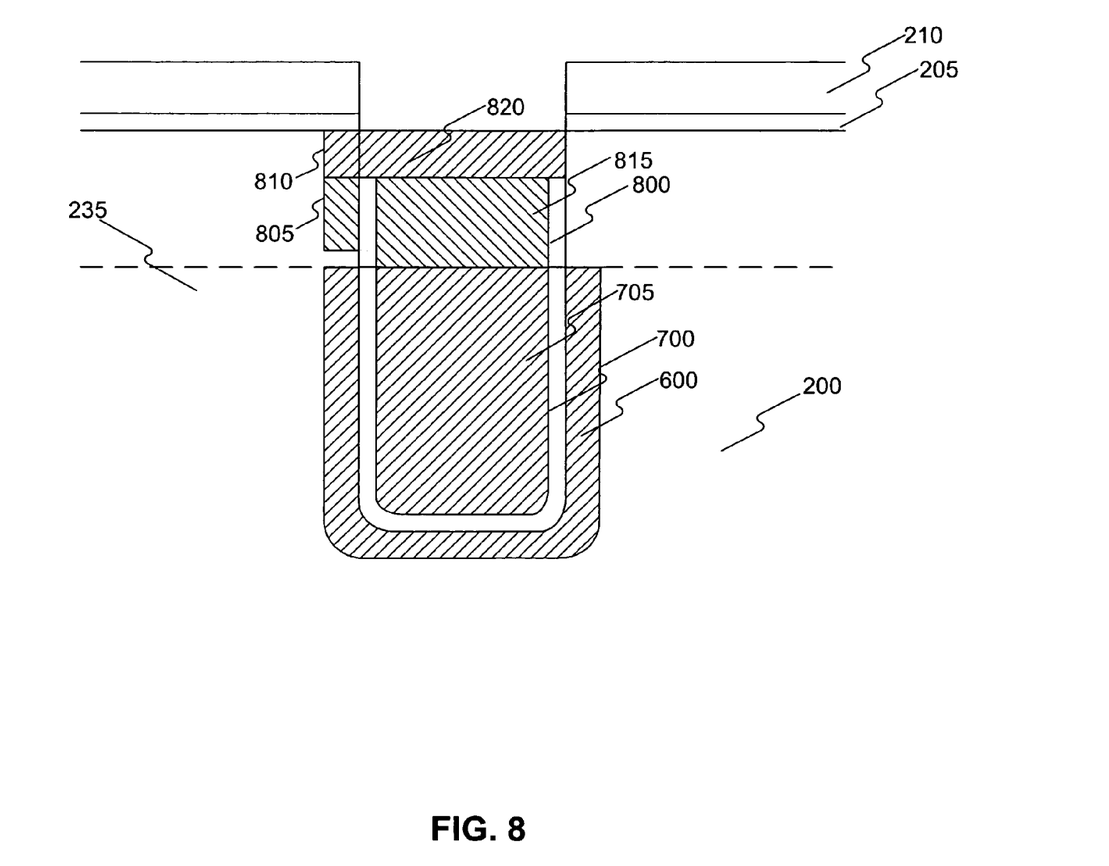

Referring to FIG. 8 (steps 155, 160, and 165 in FIG. 1), an oxide layer such as a collar oxide layer 800 is formed on the sidewall of the trench 216 above the capacitor node dielectric layer 700 (step 155), wherein both the collar oxide layer 800 and the capacitor node dielectric layer 700 are considered dielectric layers in a DRAM memory cell, and a thickness of the collar oxide layer 800 is thicker than a thickness of the capacitor node dielectric layer 700. The collar oxide layer 800 is formed by first depositing an oxide layer on the upper sidewall of the trench 216, over the upper storage node 705, and over the hard mask layer 210. The oxide layer is preferably formed using CVD. After depositing the collar oxide layer 800 as described above, a portion of the collar oxide layer 800 above the upper storage node 705 is removed. Preferably, the collar oxide layer 800 has a thickness of about 40 nm to about 60 nm. The formation of collar oxide layer 800 is completed by annealing at a temperature of about 1000° C. for about 30 minutes. This high-temperature annealing step has a twofold purpose: to densify the collar oxide layer 800 and to strengthen the quality of the buried SiC and SiGeC layers 805 and 810, respectively. It is believed that after this annealing step, about 100 nm to about 150 nm of SiGeC 810 will be formed in a channel region of a vertical parasitic NMOS that will be discussed below with reference to FIG. 9.

Next, still referring to FIG. 8, a storage node connector 815 is formed in the trench 216 above the upper storage node 705, wherein the upper storage node 705, the storage node connector 815, and the node connector 820 are considered conductive layers in a DRAM memory cell. Preferably, the storage node connector 815 is formed by first depositing a polysilicon layer atop the hard mask layer 210 and filling into the trench 216. CMP may be used to remove the polysilicon layer above the hard mask layer 210. Then, an etch-back step is applied to reduce the thickness of polysilicon layer inside the trench, preferably to about the same height as the upper edge of the buried SiC 805. Furthermore, after the polysilicon layer etch-back step, the exposed portion of the collar oxide layer 800 is etched to the same height as the storage node connector 815. Then another node connector 820 is deposited to fill the remaining open portion of the trench 216. Node connector 820 is preferably polysilicon. Thus, there exists an electrical connection between the upper storage node 705, the storage node connector 815, and node connector 820.

Figure 9:
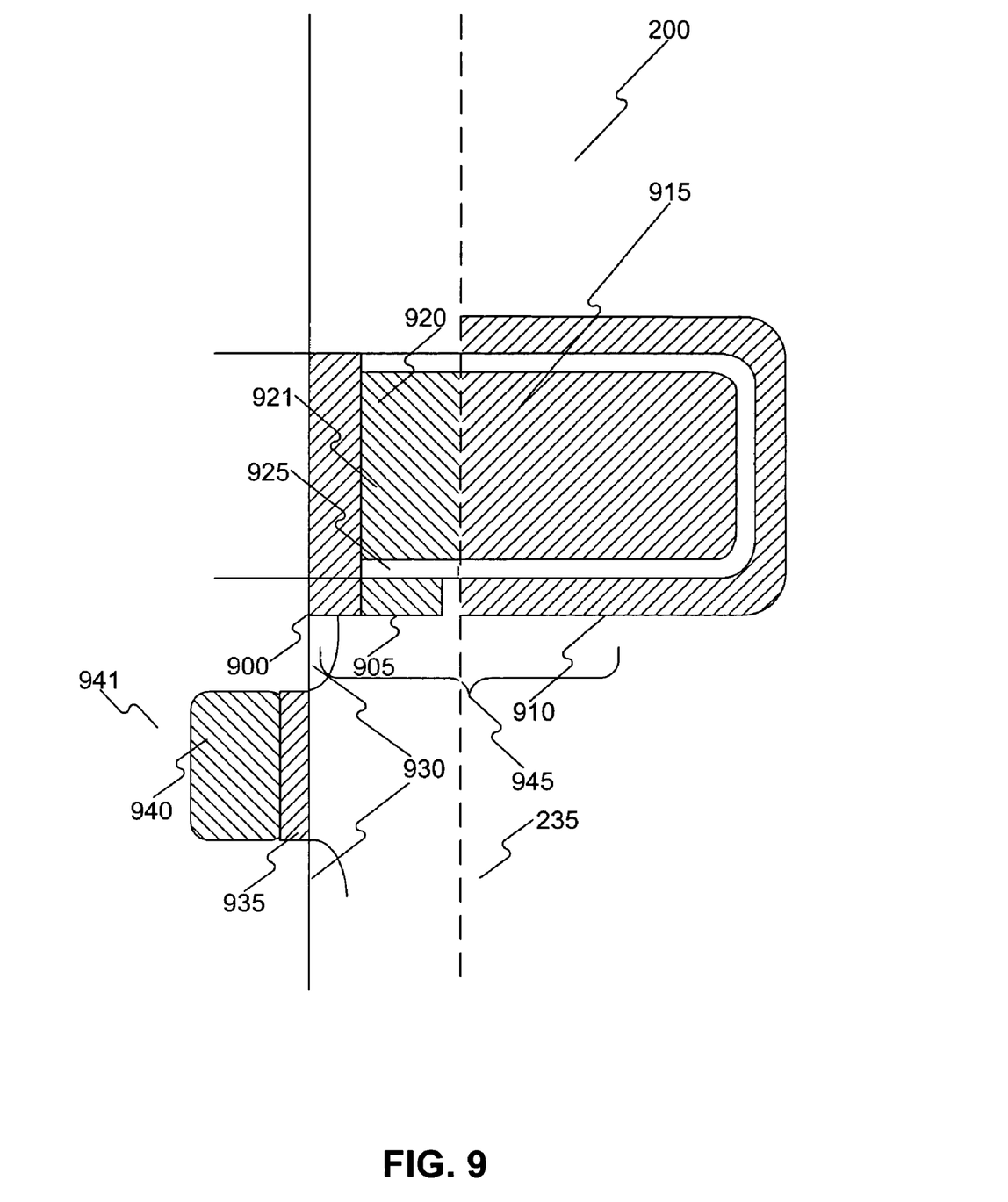

Referring to FIG. 9 (broadly described by step 170 in FIG. 1), a MOS transistor 941 (including source and drain regions 930, gate oxide layer 935, and gate electrode 940) over and adjacent to the trench capacitor is fabricated by forming first and second impurity regions, such as source and drain regions 930, in the substrate 200 in the outer perimeter of the upper sidewall of the trench 216 and adjacent to it. Source and drain regions 930 are spaced apart from each other, and one of the source and drain of source and drain regions 930 is electrically coupled with SiGeC layer 805 (now SiGeC "source" 900 in FIG. 9). Preferably, the source and drain regions 930 are formed by doping and a thermal drive-in process to diffuse the dopants into the substrate 200. Conventional fabrication processes can be used to complete MOS transistor 941, including the formation of a gate oxide layer 935 and gate electrode 940.

Still referring to FIG. 9, a parasitic vertical NMOS transistor 945 is illustrated, which is depicted by a 90° rotation of the trench capacitor shown in FIG. 8. This parasitic vertical NMOS transistor 945 is composed of a SiGeC "source" 900, buried SiC "channel" 905, "drain" 910, and polysilicon "gate" 920. It is believed that the existence of the buried SiC channel 905 will reduce leakage current from the trench capacitor to the MOS transistor via the parasitic vertical NMOS transistor 945 because of the wide bandgap of SiC (discussed previously). The wider bandgap means that a higher threshold node voltage will need to be applied to switch on the NMOS transistor 945 and less leakage will occur because of the wider bandgap in SiC channel 905. Moreover, the presence of SiGeC provides a slight increase in the already wide bandgap of SiC, and further reduces the resistivity in the buried strap region 305. Furthermore, with less parasitic current in the off-state, the recess depth of the polysilicon 915 can be reduced, thereby enhancing cell capacitance without contributing to increased leakage.

Thus, if a logical "1" is stored in the memory cell and the threshold voltage of the parasitic NMOS transistor 945 is not high enough, charge will flow through the channel 905 and degrade signal strength. For logical "0," no charge flows through the channel 905, since almost zero voltage is applied on the polysilicon "gate" 920.

Therefore, according to the present invention, junction leakage can therefore be suppressed by several orders of magnitude as compared to a conventional Si substrate. The memory cell consistent with an aspect of the present invention thus has enhanced cell capacitance and simultaneously suppressed leakage current by incorporating SiC and SiGeC into the DRAM fabrication process.

It will be apparent to those skilled in the art that various modifications and variations can be made in the disclosed structures and methods without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A process for manufacturing a DRAM memory cell, comprising:

providing a substrate having a trench therein and a surface covered by a mask layer;

forming at least one cover layer for covering a portion of the trench;

doping an exposed portion of a sidewall of the trench in the substrate with carbon and germanium impurities for forming a carbon doped region and a germanium doped region, the carbon doped region extending a first depth into the semiconductor substrate, and the germanium doped region extending a second depth into the semiconductor substrate, the second depth being less than the first depth; and performing at least one heat treatment.

2. The process for manufacturing a DRAM memory cell according to claim 1, wherein the doping is performed with a metal vapor vacuum arc (MEVVA) ion source.

3. The process for manufacturing a DRAM memory cell according to claim 1, wherein the doping is performed at an energy of 35 KeV.

4. The process for manufacturing a DRAM memory cell according to claim 1, wherein silicon carbide is formed in at least a portion of the carbon doped region by the at least one heat treatment.

5. The process for manufacturing a DRAM memory cell according to claim 1, the germanium doped region including silicon germanium carbide formed by the at least one heat treatment.

6. The process for manufacturing a DRAM memory cell according to claim 1, wherein the carbon doped region is implanted to a concentration of about $8 \times 10^{15}$ cm$^{-2}$ to about $3 \times 10^{16}$ cm$^{-2}$.

7. The process for manufacturing a DRAM memory cell according to claim 1, wherein the germanium doped region is implanted to a concentration of about $1 \times 10^{15}$ cm$^{-2}$ to about $5 \times 10^{15}$ cm$^{-2}$.

8. The process for manufacturing a DRAM memory cell according to claim 1, wherein the germanium doped region is implanted from about 100 to about 150 nm into the substrate in a direction perpendicular to the surface of the semiconductor substrate.

9. The process for manufacturing a DRAM memory cell according to claim 1, wherein the carbon doped region is implanted at an angle of about 7° to about 12° from a direction perpendicular to the surface of the substrate.

10. The process for manufacturing a DRAM memory cell according to claim 1, wherein the germanium doped region is implanted at an angle of about 10° to about 15° from a direction perpendicular to the surface of the substrate.

11. A process for manufacturing a DRAM memory cell, comprising:

providing a substrate having a trench therein and a surface covered by a mask layer;

forming a doped oxide layer for covering a portion of the trench;

doping an exposed portion of a sidewall of the trench in the substrate with carbon and germanium impurities for forming a carbon doped region and a germanium doped region, the carbon doped region extending a first depth into the semiconductor substrate, and the germanium doped region extending a second depth into the semiconductor substrate, the second depth being less than the first depth;

forming a protective layer covering the doped oxide layer and the exposed portion of the sidewall of the trench;

performing a heat treatment for forming a buried plate region;

removing the doped oxide layer and the protective layer;

forming a dielectric layer inside the trench;

forming a first conductive layer with predetermined depth to act as a storage node;

forming a collar oxide layer in the trench and on top of the first conductive layer, the collar oxide layer being surrounded by the carbon doped region; and performing a heat treatment for forming a silicon carbide region in a portion of the carbon doped region and for forming a silicon germanium carbide region in the germanium doped region.

12. The process for manufacturing a DRAM memory cell according to claim 11, wherein the carbon doped region is implanted to a concentration of about $8 \times 10^{15}$ cm$^{-2}$ to about $3 \times 10^{16}$ cm$^{-2}$.

13. The process for manufacturing a DRAM memory cell according to claim 11, wherein the germanium doped region is implanted to a concentration of about $1 \times 10^{15}$ cm$^{-2}$ to about $5 \times 10^{15}$ cm$^{-2}$.

14. The process for manufacturing a DRAM memory cell according to claim 11, wherein the germanium doped region is implanted from about 100 to about 150 nm into the substrate in a direction perpendicular to the surface of the semiconductor substrate.

15. The process for manufacturing a DRAM memory cell according to claim 11, wherein the carbon doped region is implanted at an angle of about 7° to about 12° from a direction perpendicular to the surface of the substrate.

16. The process for manufacturing a DRAM memory cell according to claim 11, wherein the germanium doped region is implanted at an angle of about 10° to about 15° from a direction perpendicular to the surface of the substrate.

* * * * *